(12) United States Patent
Zhu et al.

(10) Patent No.: US 8,599,361 B2
(45) Date of Patent: Dec. 3, 2013

(54) NANOMETER-PRECISION SIX-DEGREE-OF-FREEDOM MAGNETIC SUSPENSION MICRO-MOTION TABLE AND APPLICATION THEREOF

(75) Inventors: Yu Zhu, Beijing (CN); Ming Zhang, Beijing (CN); Guang Li, Beijing (CN); Jinsong Wang, Beijing (CN); Jinchun Hu, Beijing (CN); Wensheng Yin, Beijing (CN); Kaiming Yang, Beijing (CN); Li Zhang, Beijing (CN); Jing Ma, Beijing (CN); Yan Xu, Beijing (CN); Yujie Li, Beijing (CN); Li Tian, Beijing (CN); Guanghong Duan, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/635,168

(22) PCT Filed: Mar. 15, 2011

(86) PCT No.: PCT/CN2011/071822
§ 371 (c)(1),
(2), (4) Date: Oct. 5, 2012

(87) PCT Pub. No.: WO2011/113347
PCT Pub. Date: Sep. 22, 2011

(65) Prior Publication Data
US 2013/0038853 A1 Feb. 14, 2013

(30) Foreign Application Priority Data
Mar. 19, 2010 (CN) .............................. 201010131056

(51) Int. Cl.
*G03B 27/42* (2006.01)
*G03B 27/58* (2006.01)
*G03B 27/62* (2006.01)
*H02K 41/02* (2006.01)

(52) U.S. Cl.
USPC ......... 355/75; 310/12.05; 310/12.06; 355/53; 355/72

(58) Field of Classification Search
CPC ... G03F 7/20; G03F 7/70716; G03F 7/70758; H01L 21/68
USPC ................. 310/12.05, 12.06, 12.21; 318/649; 355/53, 72, 75
See application file for complete search history.

(56) References Cited

U.S. PATENT DOCUMENTS

| | | | |
|---|---|---|---|
| 2003/0030782 A1 | 2/2003 | Watson et al. | |
| 2008/0158539 A1 | 7/2008 | Shibata | |
| 2008/0285004 A1* | 11/2008 | Binnard et al. | 355/72 |
| 2010/0187917 A1 | 7/2010 | Zhu et al. | |

FOREIGN PATENT DOCUMENTS

CN 1544991 A 11/2004
(Continued)

*Primary Examiner* — Toan Ton
*Assistant Examiner* — Colin Kreutzer
(74) *Attorney, Agent, or Firm* — Kubotera & Associates, LLC

(57) ABSTRACT

A nanometer precision six-DOF magnetic suspension micro-stage and the application thereof are provided which are mainly used in semiconductor photolithography devices. The micro-stage includes a cross support and four two-DOF actuators. Each 2-DOF actuator comprises a vertically polarized permanent magnet, a horizontal force coil and a vertical force coil; the permanent magnet being mounted on an end of the cross support, the horizontal force coil and the vertical force coil being arranged on a side of and below the permanent magnet respectively and being spaced apart from the permanent magnet; the cross support and four vertically polarized permanent magnets constitute a mover of the micro-stage; the horizontal force coil and the vertical force coil being fixed by a coil framework respectively and constituting a stator of the micro-stage; and the stator being mounted on a base of the micro-stage. A dual-wafer table positioning system of a photolithography machine may be constructed by two said micro-stages in combination with a two-DOF large stroke linear motor. The present invention features simple structure, large driving force, small mass and absence of cable disturbance, and is possible to realize high precision, high acceleration six-DOF micro-motion.

3 Claims, 3 Drawing Sheets

FOREIGN PATENT DOCUMENTS

| | | |
|---|---|---|
| CN | 101078889 A | 11/2007 |
| CN | 101290476 A | 10/2008 |
| CN | ZL200710118130.5 C | 7/2009 |
| CN | 101609265 A | 12/2009 |
| CN | 101807010 A | 8/2010 |
| WO | 2008139964 A1 | 11/2008 |

* cited by examiner

(12) United States Patent

NANOMETER-PRECISION SIX-DEGREE-OF-FREEDOM MAGNETIC SUSPENSION MICRO-MOTION TABLE AND APPLICATION THEREOF

FIELD OF THE INVENTION

The present invention relates to a nanometer precision six-DOF (degree of freedom) magnetic suspension micro-stage that mainly applies to semiconductor photolithography devices, belonging to the field of ultraprecise machining and detection device.

BACKGROUND

With development of technology, dimensions involved in manufacturing fields come to nanometer level from micrometer level. In the process, high precision micro-stages play the roles of nanometer level positioning and machining A nanometer precision micro-stage generally refers to a motion platform with a stroke on the order of millimeter and a precision up to nanometer. In the development of nanometer precision micro-stage driving technology and supporting technology, the following ever existed: piezoelectric ceramic driven flexible hinge supported micro-stage, short stroke voice coil motor driven air floating supported micro-stage and Lorenz motor driven magnetic suspension supported micro-stage.

Piezoelectric ceramic in combination with flexible hinge is a common means for realizing micro-motion which features compact structure, small volume and high displacement resolution. However, the piezoelectric ceramics has a shortage that it moves only within a small range. A 100 millimeter long piece of piezoelectric ceramic is usually required to generate a displacement of 100 micrometer. Piezoelectric ceramics suffer bad characteristics such as hysteresis, creeping and nonlinearity under electric field, which makes their repeatability reduced and transient response slowed down, and their displacement characteristic is also influenced directly by signal frequency, load and history conditions.

Short stroke voice coil motor driven air floating micro-stages overcome traditional contact guide's inability of high precision positioning under high speed and high acceleration, and are widely used in single DOF or plane structures due to their inherent zero friction, low power dissipation, cleanness and excellent dynamic response characteristics. In order to realize six DOF, short stroke voice coil motor driven, air floating micro-stages, it usually adopts a multiple stage structure in which a plurality of layers are connected one by one in series, resulting in a bulky structure, increased inertia for micro-stages and extended time for achieving stabilization. Air floating micro-stages are also difficult to be used in vacuum environment.

Lorenz motor driven, magnetic suspension micro-stages are new type of micro-stages, which are directly driven by electromagnetic force, in which electromagnetic field functions to generate a force perpendicular to the direction of object surface and current in coils is controlled in terms of magnitude to control the magnitude of electromagnetic force, so as to support and drive micro-stages to undergo precise micro-motion. Since a magnetic suspension micro-stage uses contactless magnetic suspension driving technique for both motion platform and driving mechanism, there is no frictional force or wear and tear of machinery parts. Compared with air floating micro-stages, magnetic suspension micro-stages are characterized by silence and no high-frequency vibration and it omits complex structures and components such as gas path and air supply in air floating support, having advantages in terms of strokes, precision and multi-DOF realization. Depending on generation of electromagnetic force, magnetic suspension micro-stages are usually classified into those driven based on Lorentz principle and those driven based on variable magnetic resistance principle, and further classified into moving coil type and moving iron type in terms of arrangement.

Chinese Patent of Invention ZL 200710118130.5 disclosed a six-DOF micro-stage constructed by a three-DOF planar motor and three short stroke voice coil motor drivers in vertical direction with a parallel topology, which breaks through the limitation of piezoelectric ceramics driving, flexible hinge supporting six-DOF micro-stages which were used earlier or the limitation of a multi-level cascading mode of an air floating supporting short stroke voice coil motor, and which realizing significant innovation in structure design. However, the six-DOF micro-stage uses a combination structure of three-DOF in horizontal direction and three-DOF in vertical direction, in which two layers of permanent magnets on top of each other are used in horizontal direction and three short stroke voice coil motors are used in vertical direction, which makes the six-DOF micro-stage have a still complex structure.

SUMMARY

An object of the present invention is to provide a nanometer precision six-DOF magnetic suspension micro-stage with a novel structure for dynamically compensating with nanometer precision for positioning error of a silicon wafer table of a lithography machine and realizing leveling and focusing of the silicon wafer table of the lithography machine.

The technical proposal of the present invention is as follows:

A nanometer precision six-DOF magnetic suspension micro-stage comprises a cross support and four 2-DOF actuators each comprising a vertically polarized permanent magnet, a horizontal force coil and a vertical force coil; the permanent magnet being mounted on an end of the cross support, the horizontal force coil and the vertical force coil being arranged on a side of and below the permanent magnet respectively and being spaced apart from the permanent magnet; said cross support and the four vertically polarized permanent magnets constituting a mover of the micro-stage; the horizontal force coil and the vertical force coil being fixed by a coil framework respectively and constituting a stator of the micro-stage; and the stator of the micro-stage being mounted on a base of the micro-stage.

Said nanometer precision six-DOF magnetic suspension micro-stage further comprises a four-path dual-frequency laser interferometer and four capacitive sensors as a position feedback element, in which the dual-frequency laser interferometer has a mirror mounted on a side of said permanent magnet for detecting displacement in horizontal direction, the capacitive sensors are disposed under the mover of the micro-stage for detecting displacement in vertical direction.

In one application of the present invention, two nanometer precision six-DOF micro-stages according to the invention are employed in combination with a two-DOF large stroke linear motor to constitute a dual-wafer table positioning system of a photolithography machine.

Said nanometer precision six-DOF micro-stage of the present invention provides advantages of simple structure, large driving force, small mass, convenience of heat dissipation and absence of cable disturbance, and is apt to realize high precision, high acceleration six-DOF micro-motion.

In the figures:
1—stator;
2—mover;
3—base;
5—permanent magnet;
6—horizontal force coil;
7—vertical force coil;
8—coil framework;
9—cross support;
10—mirror;
11—capacitive sensor;
15—six-DOF micro-stage;
16—silicon wafer;
17—X1 linear motor;
18—X2 linear motor;
19—Y linear motor.

DETAIL DESCRIPTION

Figure 1:
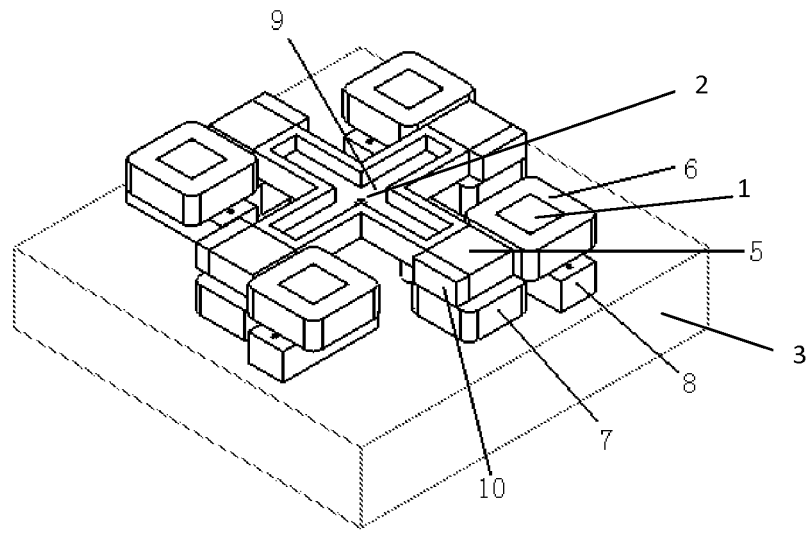
FIG. 1 is a perspective illustrating a three dimensional structure of the nanometer precision six-DOF magnetic suspension micro-stage provided in the present invention.
Figure 2:
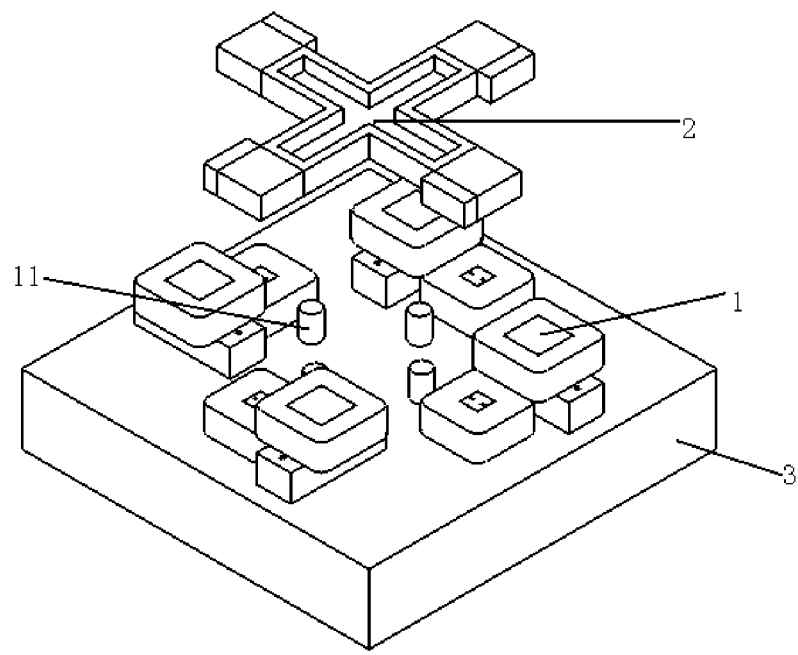
FIG. 2 is an exploded view of three dimensional structure of the six-DOF micro-stage.

FIGS. 1 and 2 are respectively a perspective view showing three dimensional structure of the nanometer precision six-DOF magnetic suspension micro-stage provided in the present invention and exploded perspective view of the nanometer precision six-DOF magnetic suspension micro-stage. The micro-stage comprises a cross support 9 and four 2-DOF actuators each comprised of a vertically polarized permanent magnet 5, a horizontal force coil 6 and a vertical force coil 7; the permanent magnet 5 being mounted on an end of the cross support 9, the horizontal force coil 6 and the vertical force coil 7 being arranged on a side of and below the permanent magnet 5 respectively and being spaced apart from the permanent magnet. Said cross support 9 and four vertically polarized permanent magnets 5 constitute a mover 2 of the micro-stage; the horizontal force coil 6 and the vertical force coil 7 are fixed by the coil framework 8 and constitute a stator 1 of the micro-stage; and the stator 1 of the micro-stage is mounted on a base 3 of the micro-stage.

The nanometer precision six-DOF magnetic suspension micro-stage provided in the present invention further includes a four-path dual-frequency laser interferometer and four capacitive sensors 11 as a position feedback element; in which the dual-frequency laser interferometer has a mirror 10 mounted on a side of said permanent magnet 5 for detecting displacement in horizontal direction, the capacitive sensors 11 are disposed under the mover 2 of the micro-stage for detecting displacement in vertical direction.

Figure 3:
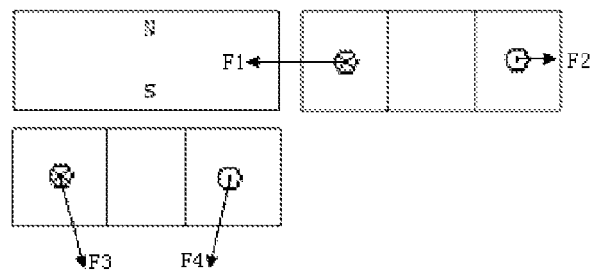
FIG. 3 shows principle of operation of a two-DOF actuator.

FIG. 3 shows the principle of operation of a two-DOF actuator. The horizontal force coil 6 is located on a side of the permanent magnet 5. Since the horizontal force coil 6 has a larger magnetic induction intensity on one of its two sides that is close to the permanent magnet 5 than the other side away from the permanent magnet 5, when a current is passing through the horizontal force coil 6, although currents on the two sides are of identical magnitude, due to the different magnetic induction intensity and based on Lorentz principle, Lorentz forces F1 and F2 are generated on the two sides of the coil respectively which are in opposite directions but of different magnitudes, then a driving force in horizontal direction is generated through composition of the forces. The vertical force coil 7 is under the permanent magnet 5. Since the magnetic field passes through the vertical force coil 7 obliquely, when current is passing through the vertical force coil 7, Lorentz forces F3 and F4 are likely generated on two sides of the coil based on Lorentz principle which are of identical magnitude and with directions shown in FIG. 3. Composition of the two forces generates a supporting force in vertical direction.

Figure 4:
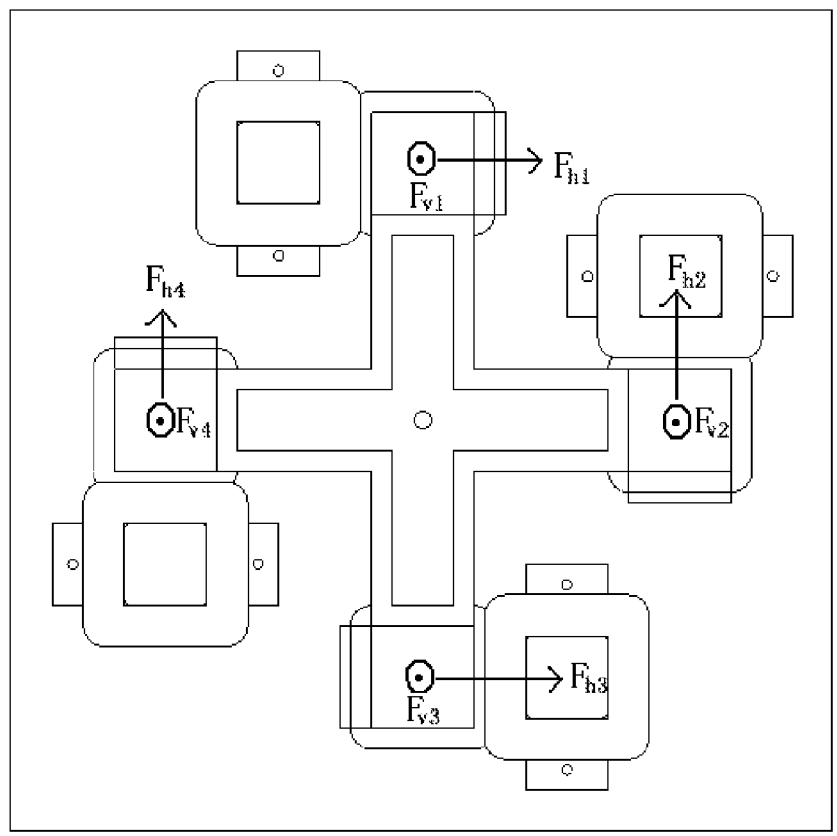
FIG. 4 shows the principle of operation of the six-DOF micro-stage.

FIG. 4 shows the principle of operation of the nanometer precision six-DOF magnetic suspension micro-stage provided in the present invention. The micro-stage contains four two-DOF actuators. According to the operating principle illustrated in FIG. 3, each two-DOF actuator generates a horizontal driving force. Therefore, the micro-stage is subject to four horizontal driving forces, i.e. $F_{h1}$, $F_{h2}$, $F_{h3}$ and $F_{h4}$. These four forces may be changed in directions by altering the direction of the currents, and the resultant force by combination of the four forces acts on the mover 2 of the micro-stage, so as to drive the micro-stage mover 2 translate in X and Y directions in the horizontal plane and rotate about Z axis. According to the operating principle illustrated in FIG. 3, each two-DOF actuator further generates a vertical driving force. Therefore, the micro-stage is also subject to four supporting forces in vertical direction, i.e., $F_{v1}$, $F_{v2}$, $F_{v3}$ and $F_{v4}$. These four forces may be changed in directions by altering the direction of the currents, and the resultant force by combination of the four forces acts on the mover 2 of the micro-stage, so as to drive the micro-stage mover 2 translate along Z axis in vertical direction and rotate about X and Y axes.

Figure 5:
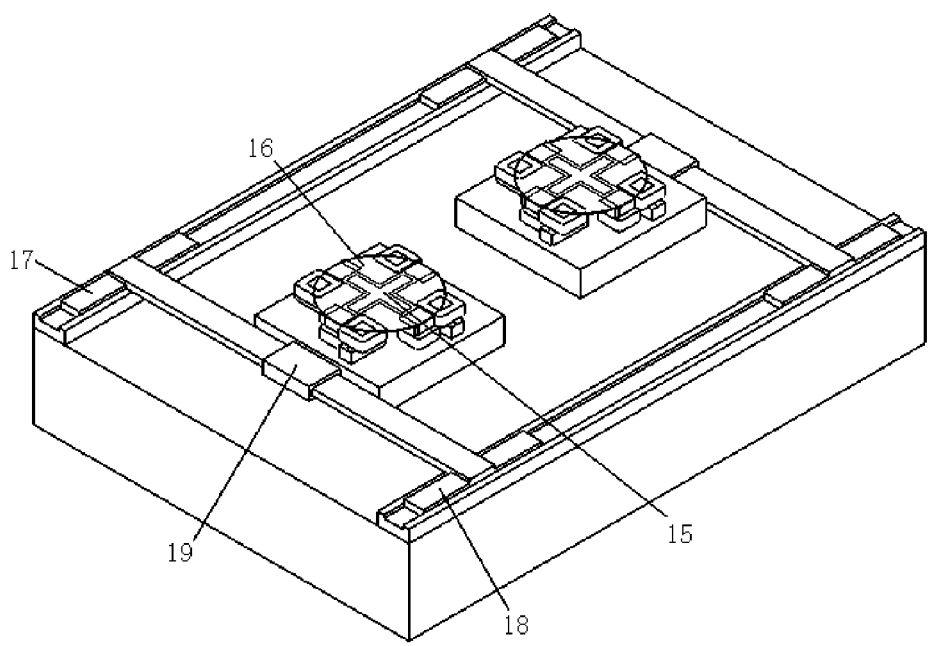
FIG. 5 shows a dual-silicon wafer table positioning system of a photolithography machine comprising said six-DOF micro-stage of the present invention.

FIG. 5 shows a silicon wafer table positioning system of a photolithography machine comprising 2 said six-DOF micro-stages of the present invention. The wafer table positioning system includes a macro-stage composed of a large stroke linear motor and a six-DOF micro-stage 15 of the present invention. The silicon wafer 16 is positioned on the six-DOF micro-stage. The macro-stage includes an X1 linear motor 17, an X2 linear motor 18 and a Y linear motor 19. The mover of the Y linear motor 19 is connected with the six-DOF micro-stage 15 to drive the silicon wafer 16 on the micro-stage for large stroke high speed motion. Horizontal motion of the six-DOF micro-stage 15 dynamically compensates for the large stroke high speed motion of the macro-stage to improve precision of the wafer table positioning system; and vertical motion thereof is for leveling and focusing of the wafer. The positioning system employs a dual wafer table structure to improve efficiency of the photolithography machine by enabling a table to undergo pre-alignment prior to exposure while the other one is in exposure.

The invention claimed is:

1. A nanometer precision six-DOF magnetic suspension micro-stage, characterized by comprising a cross support (9) and four 2-DOF actuators each comprising a vertically polarized permanent magnet (5), a horizontal force coil (6) and a vertical force coil (7); wherein, the permanent magnet (5) is mounted on an end of the cross support (9), the horizontal force coil (6) and the vertical force coil (7) are arranged on one side of and below the permanent magnet (5) respectively and being spaced apart from the permanent magnet; said cross support (9) and the four vertically polarized permanent magnets (5) constitute a mover (2) of the micro-stage; the horizontal force coil and the vertical force coil are mounted via a coil framework (8) respectively and constituting a stator (1) of the micro-stage; and the stator (1) of the micro-stage is mounted on a base (3) of the micro-stage.

2. The nanometer precision six-DOF micro-stage according to claim 1, characterized in that the nanometer precision six-DOF magnetic suspension micro-stage further comprises a four-path dual-frequency laser interferometer and four capacitive sensors (11) as a position feedback element; in which the dual-frequency laser interferometer has a mirror (10) mounted on a side of said permanent magnet (5) for detecting displacement in horizontal direction, the capacitive sensors (11) are disposed under the mover (2) of the micro-stage for detecting displacement in vertical direction.

3. An application of a nanometer precision six-DOF magnetic suspension micro-stage, characterized by using two nanometer precision six-DOF micro-stages according to claim 1 in combination with a two-DOF large stroke linear motor to constitute a dual-wafer table positioning system of a photolithography machine.

* * * * *